United States Patent [19]

Cordes, III et al.

[11] Patent Number: 4,677,043

[45] Date of Patent: Jun. 30, 1987

[54] STEPPER PROCESS FOR VLSI CIRCUIT MANUFACTURE UTILIZING RADIATION ABSORBING DYESTUFF FOR REGISTRATION OF ALIGNMENT MARKERS AND RETICLE

[75] Inventors: William F. Cordes, III, Avon; Edwin Turner, Waterbury, both of Conn.

[73] Assignee: MacDermid, Incorporated, Waterbury, Conn.

[21] Appl. No.: 795,549

[22] Filed: Nov. 1, 1985

[51] Int. Cl.$^4$ .................... G03F 9/00; G03C 11/00
[52] U.S. Cl. .................................. 430/22; 430/5; 430/311; 430/339
[58] Field of Search .............. 430/22, 5, 339, 311

[56] References Cited

U.S. PATENT DOCUMENTS

| | | | |
|---|---|---|---|
| 3,355,294 | 11/1967 | Giddings | 430/339 |
| 4,251,622 | 2/1981 | Kimoto et al. | 430/339 |
| 4,332,872 | 6/1982 | Zingher | 430/22 |
| 4,345,011 | 8/1982 | Drexhage | 430/5 |
| 4,374,915 | 2/1983 | Ahlquist et al. | 430/22 |
| 4,621,042 | 11/1986 | Pampalone et al. | 430/311 |

FOREIGN PATENT DOCUMENTS

110165  6/1984  European Pat. Off. ............ 430/339

OTHER PUBLICATIONS

Kosar, J., "Light-Sensitive Systems", J. Wiley & Sons, 1965, pp. 387–397.
Douglas, E. C., Solid State Technology, pp. 65–72, 5/1981.
Loebach, E. W., "Wafer Printing with Step-and-Repeat Aligners", IGC Conference, Carmel, Calif., 6/30–7/2/1980.

Primary Examiner—Charles L. Bowers, Jr.
Attorney, Agent, or Firm—St. Onge Steward Johnston & Reens

[57] ABSTRACT

The step-on-wafer process, also known as the step-and-repeat alignment process, for the production of very large scale integration (VLSI) microcircuitry with multi-layer interconnects, is greatly facilitated by incorporating, into at least the first layer of photoresist, a dyestuff which meets certain criteria the chief of which is that it be transparent to radiation to which the photoresist system is sensitive and that it absorb radiation of a wavelength to which the photoresist system is not sensitive. The use of photoresist systems in association with such dyestuffs has additional advantages. For example, the thickness of the photoresist layer deposited on a substrate can be checked prior to imaging without activating the photoresist.

9 Claims, No Drawings

STEPPER PROCESS FOR VLSI CIRCUIT MANUFACTURE UTILIZING RADIATION ABSORBING DYESTUFF FOR REGISTRATION OF ALIGNMENT MARKERS AND RETICLE

BACKGROUND OF THE INVENTION

1. Field of the Invention

This invention relates to photoresist processes and compositions and is more particularly concerned with an improved process and compositions for the fabrication of microelectronic circuitry using photoresist systems.

2. Description of the Prior Art

The production of microelectronic circuitry, particularly metal oxide-semiconductor integrated circuits, has shown extremely rapid growth from medium scale integration to very large scale integration (VLSI) with rapidly increasing complexity of circuitry as well as vast increases in number of bytes per chip. One of the methods currently employed to achieve the fine-line photolithography required in VLSI is that known as the step-on-wafer process or the step-and-repeat alignment process; see, for example, E. C. Douglas, Solid State Technology, May, 1981 pp. 65-72; and E. W. Loebach, VLSI Wafer Printing with Step-and-Repeat Aligners, IGC Conference, Carmel, June 30–July 2, 1980. In this procedure a pattern of individual images is produced on a wafer covered with a first layer of photoresist. The individual images are projected and exposed using a reticle (photomask), optionally having an enlarged (usually up to about 10 times) version of the image to be reproduced, and employing a projection system with appropriate reduction lens if necessary. In the production of multiple layer images it is necessary to align each new image so that it is precisely superimposed on the corresponding images produced in a previous level. In order to facilitate such alignment of images a pattern of alignment markers is incorporated into each image in the first layer of photoresist and the reticle employed to reproduce the second and any subsequent levels of images is provided with a pattern of windows which corresponds to the pattern of markers in the first level images. By bringing the windows into correct alignment with the markers in the first level image it is possible to achieve accurate superimposition of the second and any subsequent images on the first one.

It has now been found that the alignment process can be greatly facilitated, and the possibility of mismatch of images greatly reduced, by the process of the invention which, in one of its broadest aspects, provides for incorporation of certain dyestuffs into the photoresist layers as will be more fully described hereinafter.

The incorporation of dyestuffs into photoresist compositions for other purposes has been described hitherto. Illustratively, Takahashi et al U.S. Pat. No. 4,356,254 teaches the incorporation of basic carbonium dyes into photoresist compositions used in production of printing plates in order to facilitate visual inspection of the developed image. No criticality is reported as to the particular wavelength in which the dyestuff must absorb or as to the relationshp between the wavelengths to which the photoresist and the dyestuff are sensitive.

Namiki et al U.S. Pat. No. 4,268,601 describes a process for producing photomasks in which a layer of photosensitive resin is applied to a polyvinylalcohol layer on a transparent support, optionally with a polyamide adhesive layer separating the resin from the polyvinylalcohol layer. After the photoimaging is carried out the combined layers are stripped from the support. Either the polyvinylalcohol layer or the photoresist layer can incorporate a pigment or dyestuff, the preferred embodiment having a dye in the polyvinylalcohol layer and a pigment in the photoresist layer. No criticality is attributed to the wavelength at which the dyestuff or pigment absorbs except that, if the wavelengths of absorption maxima for the colorant and the photoresist differ by not more than 5 namometers, it is recommended that the colorant be present only in the polyvinylalcohol layer and not in the photoresist layer. Where the difference exceeds this minimum the colorant can be present in either or both layers.

Peters et al U.S. Pat. No. 3,615,538 describes improving the physical properties of a photoresist image on a printing plate by incorporating a silane compound into the photoresist. Dyes or pigments can also be incorporated but no criticality is attributed to the absorption characteristics of the dye.

Gilson et al U.S. Pat. No. 3,647,447 teaches the coloring of photoresist images, particularly those derived from polycinnamates, using dyestuffs which have low absorption at 350–480 nm and are not soluble in the developer solution used in the imaging process.

Klupfel et al U.S. Pat. No. 4,241,166 describes incorporating into photoresist systems certain dyes which exhibit temporary decolorization of exposure to radiation used in the imaging process.

Sysak U.S. Pat. No. 4,341,860 teaches photoresist compositions which contain a leuco dye and a cyclohexadienone compound which serves to oxidize the leuco dye upon exposure to image-forming radiation.

Chen et al U.S. Pat. No. 4,362,809 uses a dyestuff to reduce problems in photoimaging caused by reflection of radiation from a substrate-photoresist interface. A two layer photoresist is provided on a substrate, the bottom layer incorporating a dyestuff which will absorb radiation at the wavelength used to image the top layer.

It has not been suggested previously that accuracy of alignment in the step-and-repeat alignment process, hereinafter referred to as the "stepper" process, can be greatly improved and facilitated by employing photoresist systems in association with dyes which meet certain very specific criteria. Nor has it been suggested previously that certain other advantages, to be described hereinafter, flow from the use of such photoresist systems in association with said dyes.

SUMMARY OF THE INVENTION

It is an object of the invention to provide an improved process for production of multiple level photoresist images by the stepper process.

It is a further object of the invention to improve the ease and accuracy with which successive levels of photoresist images can be superimposed one upon another in the fabrication of VLSI circuitry.

It is yet a further object of the invention to provide a method of accurately aligning successive levels of photoresist images, which are to be superimposed upon one another, irrespective of irregularities or distortions in the substrate supporting the images.

Another object of the invention is to provide an accurate method of determining the average thickness of a photoresist layer on a substrate prior to imaging of said layer.

Still another object of the invention is to improve the accuracy in determining critical dimensions of an exposed and developed image.

Yet another object of the invention is to provide certain novel photoresist compositions.

These objects, and other objects which will become apparent from the description which follows, are achieved by the processes and compositions of the invention. Thus, in one aspect, the invention relates to means for rendering clearly detectable, using light to which the photoresist is not sensitive, the alignment markers incorporated into each of the individual images produced, using a photoresist system followed by etching, ion implantation doping and like processes, (hereinafter referred to as "pattern-generation") in the first level of a multiple level VLSI circuitry on a silicon wafer or like substrate in a stepper process. By this means it is possible then to align accurately the image which is to be projected through an appropriate reticle to fabricate the second and any subsequent level of images which are to be superimposed precisely on the first level of images. Thus, by providing the reticle employed in the second and any subsequent level imaging with windows or like means in a pattern corresponding precisely to that of the alignment markers in the first level it is possible, prior to projection of each image in the second or any subsequent levels, to bring the said markers into correct registry with the windows in the image to be projected by the reticle. The alignment process can be carried out manually by observation through the lens employed in the projection system used in the photoimaging process or it can be carried out using appropriate automatic optical sensing devices. Generally speaking, the latter devices involve spectral analysis of radiation reflected from the markers after being transmitted thereto via the windows in the reticle. Previously it was found that the lack of sharpness and low intensity of the alignment peak being used in the analysis rendered it difficult to identify and focus the peak in order to correctly adjust alignment of the image. It has now been found unexpectedly that the incorporation of dyes into the photoresist layer or layers in accordance with the invention overcomes these difficulties and renders the characteristic alignment peak easy to identify by reason of its increased sharpness and intensity.

The means employed to render detectable the alignment markers in the photoimages in the various levels as described above can take several forms. In a preferred embodiment the photoresist employed to prepare the various levels of images has incorporated therein a dyestuff which meets a number of very specific criteria to be discussed in detail below. In a less preferred embodiment the layer of photoresist has coated thereon, prior to imaging, a layer of dyestuff advantageously by applying a coating of solution of the dyestuff in an appropriate solvent. In yet another, but less preferred embodiment, the dyestuff is applied to the images during development of the latter by incorporating the dyestuff in the developer solution.

In carrying out the above described process any of the photoresist systems known and available in the art can be employed including both negative and positive acting photoresists. The processes of the invention are, however, particularly advantageous when used in conjunction with positive photoresists.

The procedural steps and equipment employed in the art of producing VLSI circuitry by the stepper process are well-known in the art (see Douglas, supra, and Loebach, supra) and will not be described in detail herein in the interests of brevity. The novel step or steps, introduced into these known processes in order to achieve the highly desirable results herein described, comprises the means of rendering clearly detectable, using light to which the photoresist composition is not sensitive, the alignment markers which form part of each of the photoresist images produced in the first level. Any of the other variants ordinarily employed in the procedures presently used in the art, for example, the use of two or more different reticles to produce different individual images in the overall pattern in any single level, can be employed in carrying out the process of the invention. Any of the substrates previously employed in producing VLSI circuitry can be employed in the improved stepper process of the invention. Illustrative of substrates are silicon wafers whose surface has been treated to form oxides, nitrides, phosphides, metal films and the like.

DETAILED DESCRIPTION OF THE INVENTION

The dyes which are employed in the modified stepper process of the invention must meet a number of criteria in order to function appropriately to achieve the desired result. A principal and critical requirement is that there be essentially no overlap between the absorption maxima peaks of the dyestuff and the photoresist system. Thus, since most photoresist systems are formulated to be activated by actinic light having a wavelength in the range of about 250 to 450 nanometers, the dyestuff employed in association with these systems must not absorb radiation in the latter range and preferably only absorbs radiation of a wavelength of at least about 50 nanometers higher than that to which the photoresist is sensitive. Such a dyestuff can then be rendered visible in light to which the photoresist itself is not sensitive.

A further requirement of the dyestuff employed in the invention, at least when it is to be incorporated in, or coated on a layer of, the unexpected photoresist, is that it be transparent to the radiation employed to activate the photoresist. That is to say, the dye must not absorb any significant proportion, and certainly less than 10 percent, of the radiation employed in imaging the photoresist otherwise it could affect the required performance of the photoresist system.

Yet another requirement, particularly where the dye is incorporated directly into the photoresist system or is applied thereto as a coating, is that the dye must be reasonably soluble in or miscible with the solvent system employed in the photoresist and must be compatible with the other components of the photoresist, i.e. must not cause any significant separation of solids or other manifestations of incompatibility which could affect the quality of the subsequent performance of the photoresist. This consideration is of particular importance where the dye is to be incorporated in a photoresist system which is then to be stored for prolonged periods of time before ultimate use.

It is highly desirable that the dyestuff used in conjunction with the photoresist does not affect in any significant manner the rate of decomposition of the photosensitizer employed in the photoresist system. Any substantial change in the rate of decomposition could seriously affect the desirable performance of the photoresist system.

The dyestuff must not interfere in any significant manner with the adhesion of the photoresist image to the substrate. Finally it is clearly desirable that the dyestuff be not leached out of the photoresist image to any appreciable extent or be affected deleteriously in any other manner during the development of the image.

Illustrative, but not limiting, of dyes which meet the above criteria are:
Rhodamine B base and solvent soluble salts
Basic Fuchsin
Sandoz Acetosol Fire Red 3G1
Sulforhodamine B6
Sulforhodamine B The amount of dye, i.e. the concentration in parts by weight, which it is necessary to incorporate into the photoresist image in order to render the alignment markers visible to the extent necessary to carry out the improved process of the invention, will obviously vary depending upon the particular dye in question. In general, it has been found that the minimum amount of dye necessary in any given case is that which will produce an optical density in the photoresist image of not less than about 0.05. Preferably the amount of dye employed is such as to give an optical density of not less than about 0.10 and, most preferably, not less than about 0.11. Optical density (E) is defined by the equation $$E = \log I_o/I$$

wherein $I_o$ is the intensity of the incident light and $I$ is the intensity of transmitted (or reflected) light [see for example, Venkataraman, The Chemistry of Synthetic Dyes, Vol. I, p. 310, Academic Press, New York, 1952]. When expressed in terms of proportion by weight in the photoresist resin system the amount of dye necessary to achieve optical densities of the above order can vary from as little as 0.01 percent by weight to as much as about 1 percent by weight or higher depending upon the particular dye under consideration.

In addition to the modified stepper process described above, the invention also provides photoresist compositions, many of which are believed to be novel, which are characterized by the presence therein of a dye which meets all of the criteria set forth above and which is present in the composition in an amount which is sufficient to provide an optical density E in the image produced from the composition of at least about 0.05 and preferably at least about 0.10.

In addition to the use in the modified stepper process described above, these compositions can be employed in situations in which it is desirable to carry out quality control and other procedures on a photoresist layer without exposing the latter to radiation to which it is sensitive. A variety of such situations will be apparent to one skilled in the art. Illustratively, the presence of the dye in the photoresist compositions in question permits routine checks on the thickness of layers of the composition after application to a substrate before the photoimaging process has been carried out or after exposure and development. Thus, by exposing the film to radiation at or near the absorption maxima of the dye but outside the range of wavelengths to which the photoresist is sensitive, it is possible to measure accurately the precise thickness and determine the average thickness of the layer in question using standard procedures without damaging or otherwise affecting the ultimate performance of the photoresist. Illustrative of the measurement systems which can be employed to determine the thickness of the photoresist layer with dye incorporated therein is that available under the trade name NANOSPEC/AFT Model 010-0180 from Nanometrics. The Nanoline III also available from Nanometrics can be used to measure photospeed after development of a photoresist layer by CD (Critical dimension) measurements. These CD measurements are enhanced using the dyed photoresist of this invention.

The presence of the dyestuff in a photoresist system in accordance with the invention also provides a ready means to check which surface of a wafer or like substrate has been coated with a layer of the photoresist. Momentary exposure of the coated wafer or other substrate to radiation of a wavelength at which the dye will absorb but to which the photoresist is not sensitive serves to identify the coated side.

As will be obvious to one skilled in the art, the photoimages with dye incorporated which are produced by the process of the invention have the additional advantage that they can be readily inspected by visual means in order to check line definition, integrity of the image and other features.

It will be seen therefore that the present invention, in its varied aspects, represents a significant advance in the photoresist imaging steps presently employed in fabrication of VSLI circuitry and contributes to the elimination or substantial reduction of a troublesome problem due to mis-alignment of images in multiple level photoimaging processes employed in the above art.

The following example illustrate the process and compositions of the invention and the best known mode presently known to the inventor of carrying out the same but are not to be construed as limiting.

EXAMPLE 1

A photoresist composition (A) was prepared by dissolving 0.1 parts by weight of Rhodamine B base in 71.45 parts by weight of a blend of 1-methoxy-2-acetoxypropane, acetate and xylene. To the solution was added 22.5 parts by weight of a Novolak resin and 5.8 parts by weight of a 2-diaza-1-oxo-naphthoquinone-5-sulfonic acid ester of trihydroxybenzophenone. The resulting solution exhibited an optical density E of 0.110 at 559 nanometers.

A second photoresist composition (B) was prepared using exactly the same ingredients and proportions except that the proportion of Rhodamine B base was increased to 0.2 parts by weight. The resulting solution exhibited an optical density E of 0.236 at 559 nanometers.

A third photoresist composition (c) was prepared using exactly the same ingredients and proportions except that the proportion of Rhodamine B base was increased to 0.5 parts by weight. The resulting solution exhibits an optical density E of 0.992 at 559 nanometers.

A fourth photoresist compostion (D) was prepared using exactly the same ingredients and proportions except that the proportion of Rhodamine B base was increased to 1.0 parts by weight. The resulting solution exhibits an optical density E of 0.431 at 559 nanometers.

EXAMPLE 2

Composition B, prepared as described in Example 1, is employed as the photoresist composition in fabricating a complementary metal oxide semiconductor (CMOS) device on a silicon wafer using an Ultratechô 1000 Stepper. A first level of photoresist images is produced on the wafer using a reticle having a symmetrical pattern of alignment markers incorporated in the photomask. This level of positive images is developed using an alkaline developer and the wafer is then plasma etched and the photoresist image removed using an organic solvent. The resulting wafer is coated with a layer of Composition B on a substrate followed by imaging, using the stepper process, of a further pattern of individual images each of which is accurately superimposed on the corresponding image in the etched level by using a reticle having incorporated therein a symmetrical pattern of windows corresponding to the alignment markers in the images in the etched level. Alignment of each image to be projected is achieved, prior to exposure of the photoresist to actinic radiation, by projecting light of a wavelength of about 544 nanometers through the reticle windows and adjusting the position of the wafer until the signal peak from the radiation reflected from the alignment markers in etched wafer indicates that the windows of the image projected from the reticle are in correct registry with the corresponding alignment markers. The process of applying a further coating of Composition B on a substrate and repeating the alignment and imaging procedure to produce a further pattern of images is repeated a number of times to yield the final wafer.

Reduction of "noise" or interference with the desired alignment signal was obserbed compared to comparative example 3. One shart alignment peak was observed which was easily detected.

EXAMPLE 3

(COMPARISON)

The photoresist composition of example 1 without any dye was used according to the method of Example 2. The sensing device of the stepper showed 2 poorly defined peaks making it difficult to find the desired alignment peak. Also, considerable interference or "noise" was observed which also made the alignment reading more difficult.

EXAMPLE 4

Composition C, prepared as described in Example A was used according to the method of Example 2. Reduction of "noise" was again observed. A single, well-defined alignment peak was easily detected.

EXAMPLE 5

Composition A of Example 1 was used to measure photospeed by CD/measurements (critical dimensions) using the Nanoline III. The readings were easier to detect compared to the procedure using the identical photoresist without dye incorporated therein.

What is claimed is:

1. In a stepper process for producing very large scale integrated circuits comprising:
    coating a substrate with a first layer of photoresist and subjecting it to a process cycle comprising:
    exposing said first layer to actinic radiation via a reticle;
    developing the first layer and subjecting the substrate and developed image to pattern-generation;
    removing the resist; and
    repeating the above process cycle to achieve a predetermined number of layers;
    wherein each of the images in said first layer is provided with an identical pattern of alignment markers and the reticle employed in photoimaging the second and any subsequent layers is provided with a corresponding pattern of windows which register with said pattern of markers on each of the previously formed images when the latter and the new image to be formed are in correct alignment; the improvement comprising:
    incorporating into or on to at least the second layer of photoresist composition a dyestuff which absorbs radiation at a wavelength other than that which is actinic radiation for said photoresist composition and, prior to the production of each image in the second and any subsequent layer, exposing said image in the first layer via said reticle to radiation of a wavelength at which the said dye absorbs but said photoresist composition is not activated while adjusting the relative positions of.the reticle and a preselected image in said first layer utilizing radiation reflected from the markers in the latter image so that the markers in the latter image are in accurate registry with the windows in said reticle, said dyestuff being present in an amount sufficient to produce an optical density of at least about 0.05 in said photoresist composition when exposed to radiation employed in the registration step.

2. The process according to claim 1 wherein said dye is incorporated into said photoresist composition prior to applying a layer of the latter to the substrate.

3. The process according to claim 1 wherein said dye is coated on the surface of said second layer of photoresist after the latter has been applied to said substrate.

4. The process according to claim 1 wherein the photoresist is activated by actinic light having a wavelength in the range of about 250 to about 450 nanometers and the dyestuff absorbs radiation of a wavelength at least about 50 nanometers higher than that to which the photoresist is sensitive.

5. The process according to claim 4 wherein said dyestuff absorbs radiation of a wavelength above about 455 nanometers and said photoresist system is activated by radiation of a wavelength within the range of about 350 to 375 nanometers.

6. The process according to claim 1 wherein the photoresist composition employed to produce each of said image levels is a positive photoresist composition.

7. The process according to claim 1 wherein the photoresist composition comprises a Novolak resin and a 1-oxo-2-diaza naphthoquinone-5-sulfonic acid ester photosensitizer.

8. The process according to claim 1 wherein said dyestuff is Rhodamine B base.

9. The process according to claim 1 wherein said dyestuff has an absorption maxima above about 455 nanometers, is transparent to radiation employed in activating said photoresist composition, is miscible with the solvent employed in said photoresist composition, is compatible with the other components of said photoresist composition and does not effect significantly the rate of decomposition of the photosensitizer employed in said photoresist under the action of the radiation employed in the photoimaging process.

* * * * *